United States Patent
Kim et al.

(10) Patent No.: US 12,431,441 B2
(45) Date of Patent: Sep. 30, 2025

(54) INTERLAYER DIELECTRIC STACK OPTIMIZATION FOR WAFER BOW REDUCTION

(71) Applicant: Intel Corporation, Santa Clara, CA (US)

(72) Inventors: Gwang-Soo Kim, Portland, OR (US); Dimitrios Antartis, Hillsboro, OR (US); Han Ju Lee, Santa Clara, CA (US); Christopher Pelto, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 768 days.

(21) Appl. No.: 17/561,833

(22) Filed: Dec. 24, 2021

(65) Prior Publication Data

US 2023/0207486 A1   Jun. 29, 2023

(51) Int. Cl.
*H01L 21/76*    (2006.01)
*H01L 21/768*   (2006.01)
*H01L 23/00*    (2006.01)
*H01L 23/522*   (2006.01)
*H01L 23/532*   (2006.01)

(52) U.S. Cl.
CPC ...... *H01L 23/562* (2013.01); *H01L 21/76802* (2013.01); *H01L 21/76877* (2013.01); *H01L 23/5226* (2013.01); *H01L 23/53295* (2013.01)

(58) Field of Classification Search
CPC ........... H01L 23/53295; H01L 23/3226; H01L 23/562; H01L 21/76802; H01L 21/76877
USPC ....................................... 257/774
See application file for complete search history.

(56) References Cited

U.S. PATENT DOCUMENTS

| | | | |
|---|---|---|---|
| 10,002,859 B1 | 6/2018 | Bahr et al. | |
| 2003/0157783 A1 | 8/2003 | Fonash et al. | |
| 2018/0277530 A1 | 9/2018 | Or-Bach et al. | |
| 2020/0006145 A1 | 1/2020 | Li et al. | |
| 2020/0152871 A1* | 5/2020 | Leobandung | H10B 63/30 |
| 2021/0111122 A1 | 4/2021 | Liu | |

FOREIGN PATENT DOCUMENTS

EP    0989609 A1 *   3/2000

OTHER PUBLICATIONS

Cite the machine translation Pio Federico (EP-0989609-A1).*
International Preliminary Report on Patentability from PCT/US2022/049309 notified Jul. 4, 2024, 7 pgs.
International Search Report and Written Opinion from PCT/US2022/049309 notified Mar. 27, 2023, 11 pgs.

* cited by examiner

*Primary Examiner* — Phuc T Dang
(74) *Attorney, Agent, or Firm* — Essential Patents Group, LLP

(57) ABSTRACT

An integrated circuit (IC) die comprises a first metallization layer comprising first interconnect structures which each extend through the first metallization layer, a second metallization layer comprising second interconnect structures which each extend through the second metallization layer, an interlayer dielectric (ILD) stack between the first metallization layer and the second metallization layer. The ILD stack comprises a stress modulation layer on the first metallization layer and a capping layer on the stress modulation layer. A first intrinsic stress in a first material of the stress modulation layer is to mitigate a second intrinsic stress in the first metallization layer.

17 Claims, 12 Drawing Sheets

INTERLAYER DIELECTRIC STACK OPTIMIZATION FOR WAFER BOW REDUCTION

BACKGROUND

Monolithic integrated circuit (IC) fabrication has restrictions that may limit a final product's performance. For this reason, alternatives to monolithic fabrication, such as various versions of IC die (dis)integration, are being investigated. One alternative to monolithic IC fabrication is assembling multiple chips into a multi-chip package (MCP). Another alternative is wafer-level stacking. With the wafer-level stacking technique, two or more wafers of monolithically fabricated ICs are bonded together. The wafers are then singulated into multiple stacked chip packages. Yet another alternative is die stacking. In die stacking, singulated IC die are vertically stacked after all the metallization layers in the separate IC dies have been completed.

An advantage of multi-chip packages is that they may enable IC dies from heterogeneous silicon processes to be combined, enable small dis-aggregated IC dies from identical silicon processes to be combined, or both. However, there are many challenges with integrating multiple IC dies into a single IC package.

During manufacturing, multiple IC dies are fabricated on a silicon wafer. Layers in the wafer can be characterized by their intrinsic stress. When a layer has significant intrinsic stress, the strain within the layer causes the shape of the layer to change, resulting in the layer and adjoining layers to have a bowed shaped. Wafer bow can cause manufacturing issues. Various tools are used in the manufacturing process and these tools are limited with respect to a maximum wafer bow they can handle. If a tool encounters a wafer with bow exceeding the tool's limit, the wafer can be stranded within the tool. A stranded wafer requires a time-consuming intervention to recover the wafer, which inhibits high volume manufacturing.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1A:
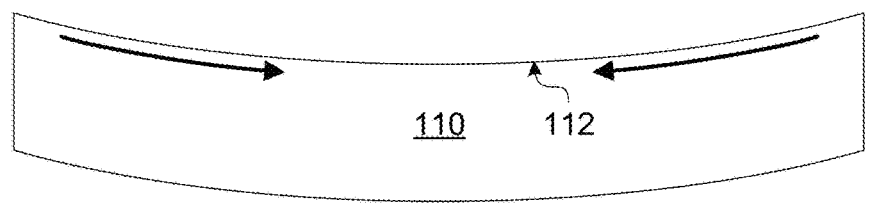
FIGS. 1A-1D are cross-sectional views of respective devices, each at a respective stage of processing, which form structures comprising a stress modulation layer and a capping layer, according to some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

The term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

The term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

The term "bond pad" generally refers to metallization structures that terminate integrated traces and vias in integrated circuit packages and dies. The term "solder pad" may be occasionally substituted for "bond pad" and carries the same meaning.

The term "solder bump" generally refers to a solder layer formed on a bond pad. The solder layer typically has a round shape, hence the term "solder bump".

The term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

The IC package examples described herein may be manufactured, in part, with bonding techniques in which metal features embedded within an insulator of one IC die are directly fused to metal features embedded within an insulator of another die. Where both the metal features and the insulators are fused, the resultant composite structure comprises a hybrid bonded interface of both metallurgically interdiffused metals and chemically bonded insulators. Prior to bonding, each IC die may be fabricated in a monolithic process separate from that of the other IC die. As such, an IC die may utilize the same or different semiconductor device fabrication technologies as the IC die to which it is bonded.

The terms wafer and substrate used in the following description include any structure having an exposed surface with which to form integrated (or other) circuit structures. The term substrate is understood to include, for example, semiconductor wafers. The term substrate is also used to refer to semiconductor structures during processing, and is understood to include other layers that have been fabricated thereupon. Both wafer and substrate include, for example, doped and undoped semiconductors, epitaxial semiconductor layers supported by a base semiconductor or insulator, as well as other semiconductor structures well known to one skilled in the art. The term substrate includes individual semiconductor die singulated from a wafer.

A structure for an electronic apparatus, according to an embodiment, includes an interlayer dielectric (ILD) structure comprised of two layers. A first layer exerts a modifying or controlling force to compensate for bow in another layer, i.e., the first layer exerts a modulating force. A second layer is a capping layer thereon. The stress modulation layer exhibits an intrinsic stress which is to correct or otherwise mitigate a bowing or other distortion of a wafer on which, or in which, the ILD structure is provided. The capping layer facilitates subsequent metallization and/or other processing—e.g., by providing a surface material which, as compared to a material of the stress modulation layer, is better suited to accommodate such subsequent processing.

A wafer or substrate may have a wafer bow, e.g., a deviation from flatness exceeding a threshold. Wafer bow may be caused by intrinsic stress in a material from which a layer is formed. For example, in a thin-film deposition process, the first deposited adatoms may occupy energy positions other than the lowest energy arrangement. Intrinsic stress is created when adatoms arriving after the first deposited adatoms trap the first deposited adatoms. Wafer bow may also be caused by a lattice mismatch between a deposited film and a substrate, as well as impurities in materials. Another reason for wafer bow may be a mismatch of coefficients of thermal expansion where one layer formed on another layer.

FIGS. 1A-1D show respective devices 100-103 each at a respective stage of processing which, according to an embodiment, form structures comprising a stress modulation layer and a capping layer thereon. FIG. 1A depicts a device 100 comprising a wafer 110 which is deformed by an intrinsic stress thereof. In the example of FIG. 1A, wafer 110 is deformed by an intrinsic compressive stress or compressive film. In the illustrative embodiment shown, such intrinsic stress (illustrated by the arrows shown) results in a side 112 of wafer 110 being bowed into a substantially concave shape. The amount of bowing by wafer 110 is exaggerated in FIGS. 1A, 1B to illustrate certain features of various embodiments.

In an embodiment, wafer 110 is or otherwise comprises a semiconductor substrate. For example, wafer 110 comprises a silicon substrate—e.g., comprising polycrystalline silicon which provides a relatively low-cost element for a manufacturing process. In various embodiments, wafer 110 further comprises a layer (not shown)—referred to herein as an "active layer"—having formed therein or thereon any of various transistors and/or other active circuit components. For example, an active layer of wafer 110 comprises processor circuitry, memory circuitry, and/or any of various other types of integrated logic circuits. Additionally or alternatively, wafer 110 comprises any of a wide variety of circuit devices including, but not limited to, capacitors, diodes, memory devices, opto-electronic devices, and/or the like. Some embodiments are not limited with respect to a particular functionality that is to be provided by such active layer (or other) circuitry of a given wafer.

In one such embodiment, wafer 110 further comprises one or more metallization layers (not shown) which are formed on an active layer of wafer 110—e.g., wherein a given one such metallization layer forms side 112. For example, wafer 110 comprises multiple metallization layers of a metallization stack, wherein the multiple metallization layers are interleaved with one or more interlayer dielectric (ILD) layers. In one such embodiment, via structures variously extend through such one or more ILD layers to facilitate electrical coupling between some or all of the metallization layers, the active layer, and/or other circuitry.

For example, the processing illustrated by FIGS. 1A-1D is to provide bonding such that first interconnect structures of wafer 110 (or substrate or individual die), at the first interconnect at side 112, are each coupled to a different respective one of second interconnect structures of another wafer 122 (or substrate or individual die). However, in an alternative embodiment, such processing instead comprises deposition, pattern, etching, metallization and/or other suitable operations to form one or more additional ILD layers (and, for example, or more additional metallization layers) of a given wafer (or substrate or individual die).

Figure 1B:
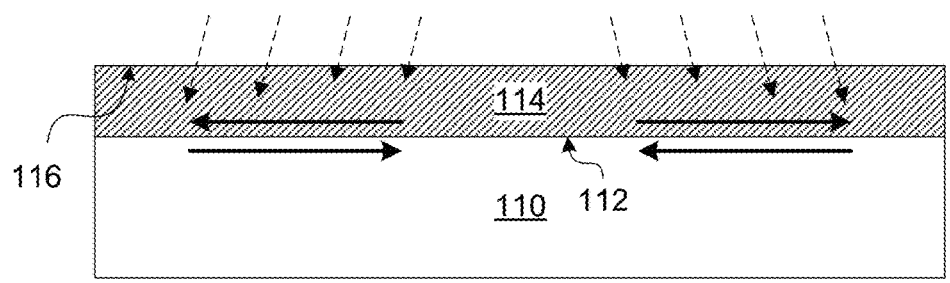

FIG. 1B shows a device 101 which results from additional processing of device 100 in FIG. 1A, according to an embodiment. As depicted in FIG. 1B, a stress modulation layer 114 is formed on side 112 of wafer 110.

In an embodiment, stress modulation layer 114 comprises a material having a relatively high tensile stress, such as silicon dioxide ($SiO_2$), silicon nitride ($Si_3N_4$), and/or any of various other suitable materials which have a tensile stress sufficient to correct or otherwise mitigate a bowing or other distortion of wafer 110. In some embodiments, stress modulation layer 114 comprises a material having an intrinsic stress in a range of 100 to 1,500 MPa, although other stress forces are applicable as well. For example, in some embodiment the range of exerted on the wafer 110 by stress modulation layer 114 is 300 to 500 MPa. In an embodiment, formation of stress modulation layer 114 on side 112 results in an intrinsic stress which is to counteract or otherwise mitigate the intrinsic stress of wafer 110.

In some embodiments, stress modulation layer 114 is formed, for example, using chemical vapor deposition (CVD) processing—e.g., including a low-pressure chemical vapor deposition (LPCVD), an atmospheric-pressure chemical vapor deposition (APCVD), a plasma-enhanced chemical vapor deposition (PECVD), or the like. Alternately, stress modulation layer 114 is formed, for example, by other methods as is known to those skilled in the art.

In the illustrative embodiment shown, the intrinsic stress of wafer 110 comprises a compressive stress at or near side 112—e.g., wherein stress modulation layer 114 is to impose an opposing tensile stress (illustrated by the arrow shown) at side 112.

According to various embodiments, stress modulation layer 114 is formed out of a material and in a way that it has a stress that is substantially equal and opposite to the stress at or near side 112 of wafer 110. For a given material, as the thickness of stress modulation layer 114 is modified, the amount of force that the stress modulation layer exerts on wafer 110 is modified. Increasing the thickness of stress modulation layer 114 increases the force on wafer 110, and vice versa. In addition, a given material can have different stress values depending on how the material is formed and the tooling used to form the layer. As one example, thermal silicon dioxide ($SiO_2$) has an intrinsic stress of 0 MPa, LPCVD silicon dioxide has an intrinsic stress of 0 MPa, and LPCVD silicon dioxide has an intrinsic stress of 300 MPa, and LPCVD/TEOS (tetraethoxysilane) silicon dioxide has an intrinsic stress of 300 MPa. As can be seen from this example, silicon dioxide would not be appropriate for stress modulation layer 114 if formed according to thermal or LPCVD methods, whereas silicon dioxide of the LPCVD and LPCVD/TEOS varieties can be used in the stress modulation layer 114 in some embodiments. In some methods, the amount of stress that needs to be mitigated is determined, then a material with some non-zero intrinsic stress is selected. The thickness of the selected material is then determined such that it the resulting stress is sufficient to mitigate the wafer bow. In other methods, the thickness of the stress modulation layer 114 may be selected, and then a material is selected such that it has an intrinsic stress value for the selected thickness that is sufficient to provide an amount of stress necessary to be mitigate wafer bow of wafer 110.

In one such embodiment, a thickness z0 (along the z-axis shown) of stress modulation layer 114 is in a range of about ten nanometers (10 nm) to about ten micrometers (10 μm). In this regard it should be appreciated that an interconnect stack can comprise multiple layers, e.g., eight or nine layers. The thickness of each layer and the interconnect structures in each layer varies. A first layer may be the thinnest. Each successive layer stacked on the first layer is thicker than the preceding layer. The thickness of the first layer may be on the order of 10 nm, whereas the thickness of the last layer may be on the order of 10 μm. The stress modulation layer 114 is sized according to where the layer appears in the stack.

Figure 1C:
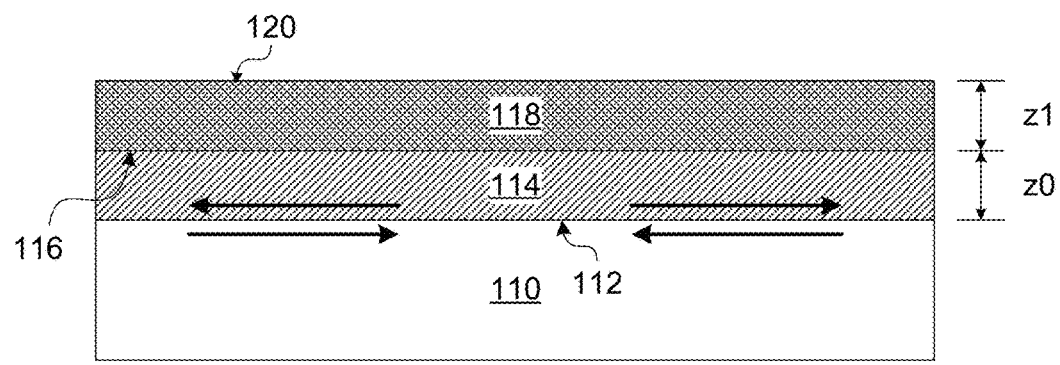

FIG. 1C shows a device 102 which results from additional processing of device 101 in FIG. 1B, according to an embodiment. For example, in device 102, bowing of wafer 110 has been removed or otherwise mitigated with the imposition the opposing tensile stress of stress modulation layer 114.

FIG. 1C shows an embodiment of a formation of a capping layer 118 on a side 116 of stress modulation layer 114. In an embodiment, capping layer 118 comprises a silicon dioxide ($SiO_2$), carbon-doped silicon dioxide (CDO) and/or any of various other suitable low-dielectric materials. In some embodiments, capping layer 118 comprises silicon dioxide, CDO, of other suitable low-dielectric material has a dielectric constant (k) value of less than one (1). In some embodiments, capping layer 118 comprises silicon dioxide, CDO, of other suitable low-dielectric material has a k value of less than four (4). In contrast, stress modulation layer 114 can comprise material with k value greater than five (5). As one example, silicon nitride ($Si_3N_4$) has a k value equal to 6.5.

Capping layer 118 is formed, for example, using chemical vapor deposition (CVD) processing—e.g., including a low-pressure chemical vapor deposition (LPCVD), an atmospheric-pressure chemical vapor deposition (APCVD), a plasma-enhanced chemical vapor deposition (PECVD), or the like. Alternately, capping layer 118 is formed, for example, by other methods as is known to those skilled in the art.

In an embodiment, stress modulation layer 114 and capping layer 118 together function as an interlayer dielectric (ILD) structure—i.e., a dielectric structure which is to provide at least partial electrical insulation between two adjacent layers of patterned metallization structures. As noted, the capping layer 118 serves an insulating function, while the stress modulation layer 114 serves a bow mitigating function.

For example, formation of capping layer 118 facilitates subsequent processing to bond, deposit or otherwise form additional metallization structures on side 120—e.g., wherein a material of capping layer 118, as compared to a material of stress modulation layer 114, is better suited to accommodate such subsequent processing. Existing tools and manufacturing processes are designed to work with ILD having a relatively low dielectric constant. Because capping layer 118 is comprised of a material with a relatively low dielectric constant, capping layer 118 is suitable for use with existing tools and manufacturing processes, whereas stress modulation layer 114 is not generally compatible with existing tools and manufacturing processes.

In one such embodiment, a thickness z1 of capping layer 118 is in a range of about ten nanometers (10 nm) to about ten micrometers (10 μm). As mentioned above, multiple layers of interconnects and associated ILD layers may be provided, each successive layer being larger than a preceding layer. In the lower layers, capping layer 118 may be in the tens of nanometers, whereas in the upper layers capping layer 118 can be on the order of 0.1 to 10 microns.

In some embodiments, capping layer 118 and stress modulation layer 114 may have substantially the same thickness, e.g., z1 equals z0. However, this is not essential. The thickness of capping layer 118 relative to stress modulation layer 114 may be determined by the amount of wafer bow that needs to mitigated and the k value of the stress modulation layer 114 material. Where stress modulation layer 114 needs to mitigate a large amount of bow, stress modulation layer 114 may be, as one example, twice as thick as capping layer 118.

Figure 1D:
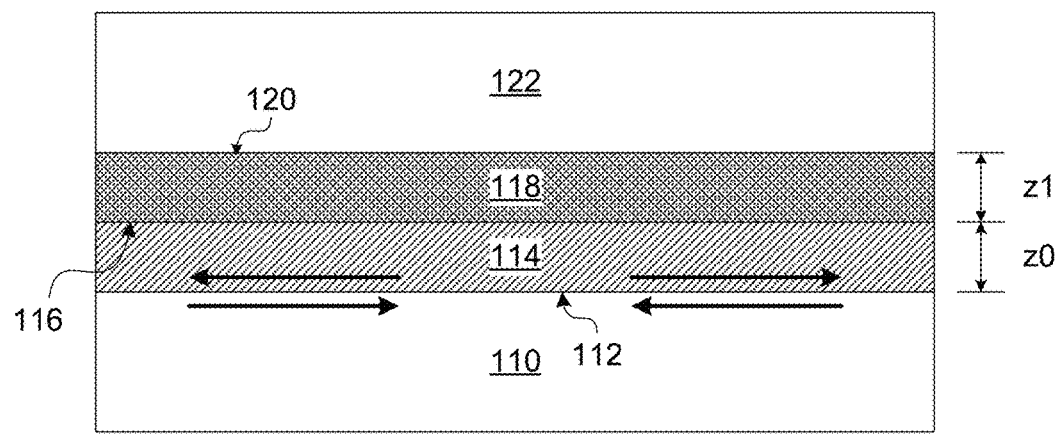

FIG. 1D shows a device 103 which results from additional processing of device 102 in FIG. 1C, according to an embodiment. For example, FIG. 1D shows an embodiment of a formation of a wafer 122 on a side 120 of capping layer 118. In some illustrative embodiments, lithographic patterning, etching, metallization and/or other suitable fabrication processes are performed to form via structures (not shown) which extend through stress modulation layer 114 and capping layer 118 to each of sides 112, 120. In one such embodiment, hybrid bonding or any of various other suitable wafer bond processes are performed to electrically couple such via structures each to a respective interconnect structure (not shown) of wafer 122.

In various embodiments, wafer 122 has features such as those of wafer 110. For example, in some embodiments, wafer 122 comprises any of various types of circuitry including, but not limited to, capacitors, diodes, transistors, memory devices, opto-electronic devices and/or the like. In an embodiment, once the processing of a wafer stack comprising wafers 110, 122 is completed, individual dies—each forming respective electronic apparatus—are cut from the completed wafer stack.

The devices described herein may be assembled and/or fabricated with one or more of the features or attributes provided in accordance with various embodiments. A number of different assembly and/or fabrication methods may be practiced to generate a device having one or more of the features or attributes described herein.

Figure 2:
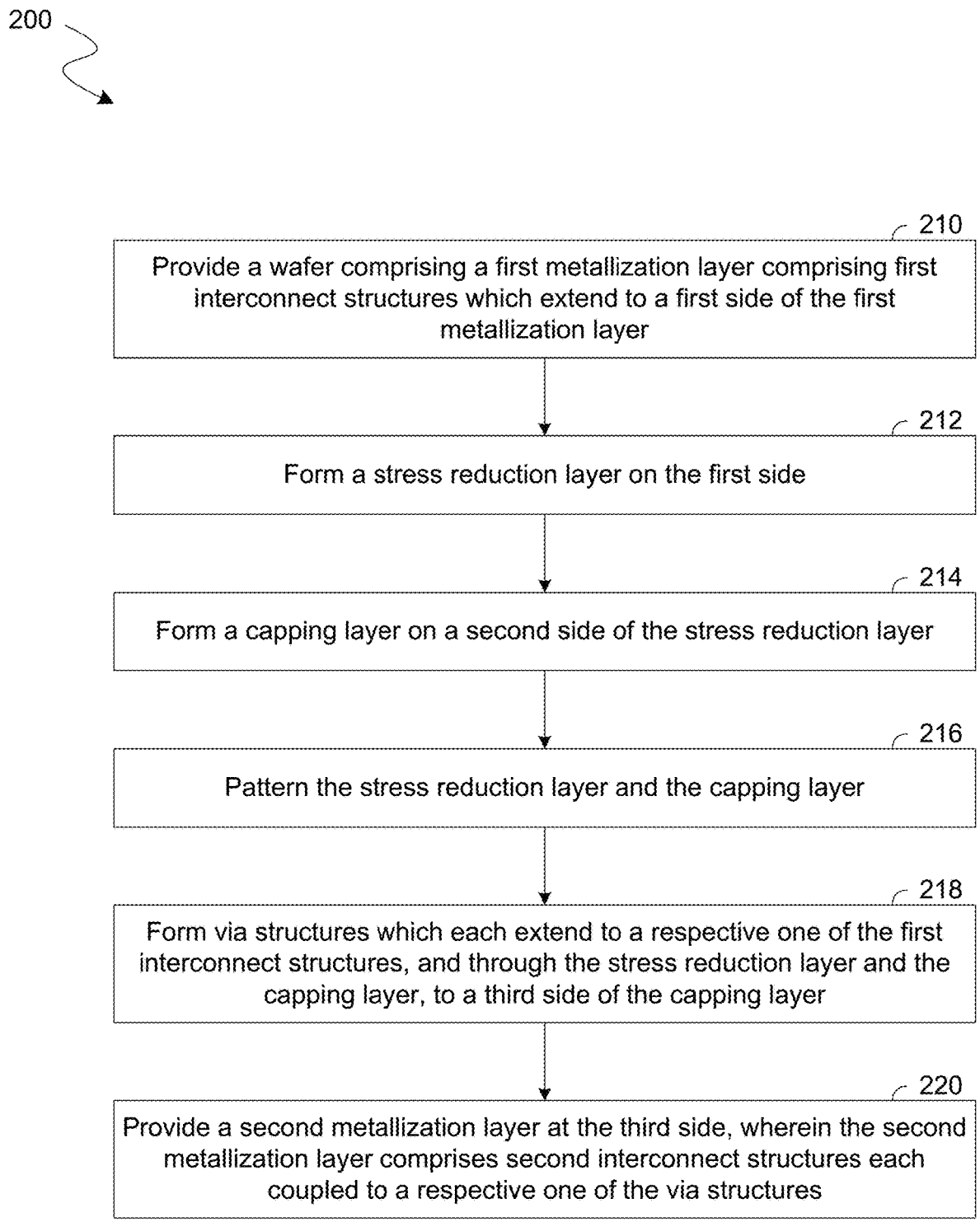
FIG. 2 illustrates a flow diagram of methods for fabricating a device comprising a stress modulation layer and a capping layer according to some embodiments.

FIG. 2 illustrates a flow diagram of methods 200 for fabricating a device comprising a stress modulation layer and a capping layer according to some embodiments. The methods may begin at 210, where a wafer is provided. The wafer comprises a first metallization layer comprising first interconnect structures which extend to a first side of the first metallization layer. The wafer may comprise a wafer bow. Operation 210 may include measuring the wafer to determine if it deviates from flatness to a degree that exceeds a threshold. In some embodiments, the measuring may include determining flatness deviation values at different regions of a surface of a wafer. At 212, a stress modulation layer on the first side is formed. The stress modulation layer may have an intrinsic stress for mitigating wafer bow in the wafer. The stress modulation layer may have a relatively high k value. The stress modulation layer may have an intrinsic a thickness, e.g., in a range of about ten nanometers (10 nm) to about ten micrometers (10 μm). In some embodiments, the stress modulation layer may be formed in a first thickness in a first region of a wafer surface and in a second thickness in a second region of the wafer surface, depending on the amount of bow measured in the respective regions. The first and second thicknesses are different. The stress modulation layer may have an intrinsic stress, e.g., in a range of 100 to 1,500 MPa. In some embodiments, the stress modulation layer may be formed with first intrinsic stress value in a first region of a wafer surface and in a second intrinsic stress value in a second region of the wafer surface, depending on the amount of bow measured in the respective regions. The first and second intrinsic stress values are different. At 214, a capping layer is formed on a second side of the stress modulation layer. The capping layer may have a relatively low k value. At 216, a pattern is formed on the stress modulation layer and the capping layer. At 218, via structures are formed. The via structures each extend to a respective one of the first interconnect structures, and through the stress modulation layer and the capping layer, to a third side of the capping layer. At 220, a second metallization layer at the third side is provided. The second metallization layer comprises second interconnect structures each coupled to a respective one of the via structures.

In some embodiments, the methods 200 are repeated for additional metallization layers. In other words, the methods are additive in that the methods can be repeated over multiple layers. Each sequence of stress reduction and capping layer can be repeated until the level of bow in the wafer is less than a minimum value or threshold.

In an experiment, an ILD structure in a wafer comprising stress modulation layer and a capping layer according to the embodiments described herein was observed to reduce wafer bow by 200 micrometers.

Figure 3A:
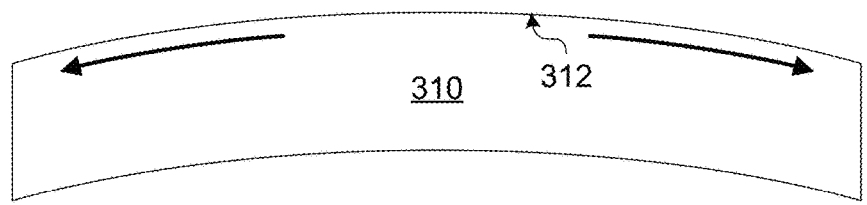
FIGS. 3A-3D are cross-sectional views of respective devices each at a respective stage of processing, which form structures comprising a stress modulation layer and a capping layer, to mitigate wafer bowing according to some embodiments.

FIGS. 3A-3D show respective devices 300-303 each at a respective stage of processing to mitigate wafer bowing according to another embodiment. FIG. 3A depicts a device 300 comprising a wafer 310 which is deformed by an intrinsic stress thereof. In the example of FIG. 3A, wafer 310 is deformed by an intrinsic tensile stress. In the illustrative embodiment shown, such intrinsic stress (illustrated by the arrows shown) results in a side 312 of wafer 310 being bowed into a substantially convex shape. In one illustrative embodiment, wafer 310 has one or more features of wafer 110, for example. The amount of bowing by wafer 310 is exaggerated in FIGS. 3A, 3B to illustrate certain features of various embodiments.

Figure 3B:
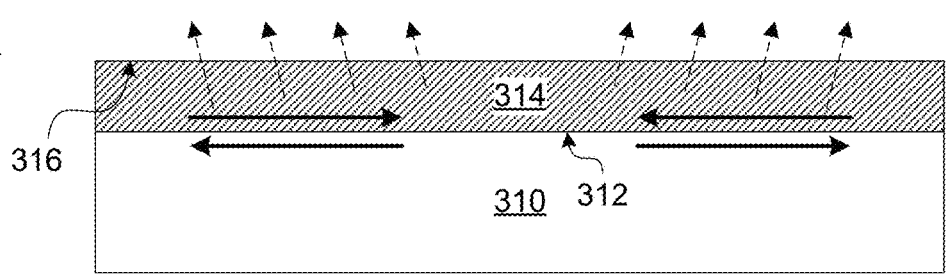

FIG. 3B shows a device 301 which results from additional processing of device 300 in FIG. 3A, according to an embodiment. As depicted in FIG. 3B, a stress modulation layer 314 is formed on side 312 of wafer 310.

In an embodiment, stress modulation layer 314 provides functionality similar to that of stress modulation layer 114, but where stress modulation layer 314 is to provide a compressive (rather than tensile) stress.

By way of illustration and not limitation, stress modulation layer 314 comprises a material having a relatively high compressive stress, such as comprises silicon dioxide ($SiO_2$), silicon nitride ($Si_3N_4$), and/or any of various other suitable materials which have a compressive stress sufficient to correct or otherwise mitigate a bowing or other distortion of wafer 310. In some embodiments, stress modulation layer 314 comprises a material having an intrinsic stress in a range of 100 to 1,500 MPa, although other stress forces are applicable as well. For example, in some embodiment the range of exerted on the wafer 310 by stress modulation layer 314 is 300 to 500 MPa. In an embodiment, formation of stress modulation layer 314 on side 312 results in an intrinsic stress which mitigates the intrinsic stress of wafer 310.

In some embodiments, stress modulation layer 314 is formed, for example, using CVD processing—e.g., including LPCVD, APCVD, PECVD, or the like. Alternately, stress modulation layer 314 is formed, for example, by other methods as is known to those skilled in the art.

In the illustrative embodiment shown, the intrinsic stress of wafer 310 comprises a tensile stress at or near side 312—e.g., wherein stress modulation layer 314 is to impose an opposing compressive stress (illustrated by the arrow shown) at side 312.

According to various embodiments, stress modulation layer 314 is formed out of a material and in a way that it has a stress that is substantially equal and opposite to the stress at or near side 312 of wafer 110. Intrinsic stress of a material depends on the material, how the material is formed, and the tooling used to form the layer. As described above with regard to stress modulation layer 114, an amount of stress that needs to be mitigated is first determined. A material with some non-zero intrinsic stress or a material thickness is selected. If the material is selected first, thickness is determined such that the resulting stress is sufficient to mitigate the wafer bow. If the thickness is selected first, a material is selected such that it has an intrinsic stress value for the selected thickness sufficient to provide an amount of stress necessary to be mitigate wafer bow.

In one such embodiment, a thickness z0 (along the z-axis shown) of stress modulation layer 314 is in a range of about ten nanometers (10 nm) to about ten micrometers (10 μm). As described above with respect to stress modulation layer 114, the stress modulation layer 314 may be sized according to where the layer appears in an interconnect stack.

Figure 3C:
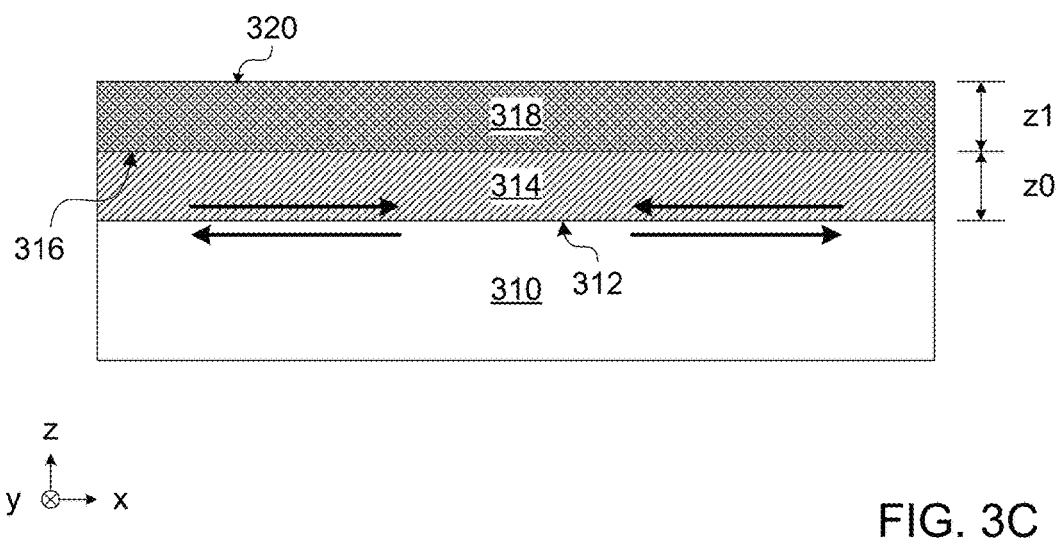

FIG. 3C shows a device 302 which results from additional processing of device 301 in FIG. 3B, according to an embodiment. For example, in device 302, bowing of wafer 310 has been removed or otherwise mitigated with the imposition the opposing compressive stress of stress modulation layer 314.

FIG. 3C shows an embodiment of a formation of a capping layer 318 on a side 316 of stress modulation layer 314. In an embodiment, capping layer 318 comprises a silicon dioxide ($SiO_2$), carbon-doped silicon dioxide (CDO) and/or any of various other suitable low-dielectric materials. In some embodiments, silicon dioxide, CDO, of other suitable low-dielectric material has a dielectric constant (k) value of less than one (1). In some embodiments, silicon dioxide, CDO, of other suitable low-dielectric material has a k value of less than one (4). In contrast, stress modulation layer 314 can comprise material with k value greater than five (5). As one example, silicon nitride ($Si_3N_4$) has a k value equal to 6.5.

Capping layer 318 is formed, for example, using chemical vapor deposition (CVD) processing—e.g., including a low-pressure chemical vapor deposition (LPCVD), an atmospheric-pressure chemical vapor deposition (APCVD), a plasma-enhanced chemical vapor deposition (PECVD), or the like. Alternately, capping layer 318 is formed, for example, by other methods as is known to those skilled in the art.

In an embodiment, stress modulation layer 314 and capping layer 318 together function as an interlayer dielectric (ILD) structure—e.g., wherein a material of capping layer 318, as compared to a material of stress modulation layer 314, is better suited to accommodate subsequent processing to bond or otherwise form a metallization layer on a side 320 of capping layer 318. The capping layer 318 serves an insulating function, while the stress modulation layer 114 serves a bow mitigating function. In addition, as noted with respect to capping layer 118, because capping layer 118 is comprised of a material with relatively low dielectric constant, it is suitable for use with existing tools and manufacturing processes that were designed for use with materials with relatively low dielectric constant, e.g., less than one. Stress modulation layer 314 is not generally compatible with existing tools and manufacturing processes due to the relatively high dielectric constant of which it is comprised, e.g., silicon nitride with a k value greater than 6.

In one such embodiment, a thickness z1 of capping layer 318 is in a range of about ten nanometers (10 nm) to about ten micrometers (10 μm). As mentioned above, multiple layers of interconnects and associated ILD layers may be provided, each successive layer being larger than a preceding layer. In the lower layers, capping layer 318 may be in the tens of nanometers, whereas in the upper layers capping layer 318 is can be on the order of 0.1 to 10 microns.

Figure 3D:
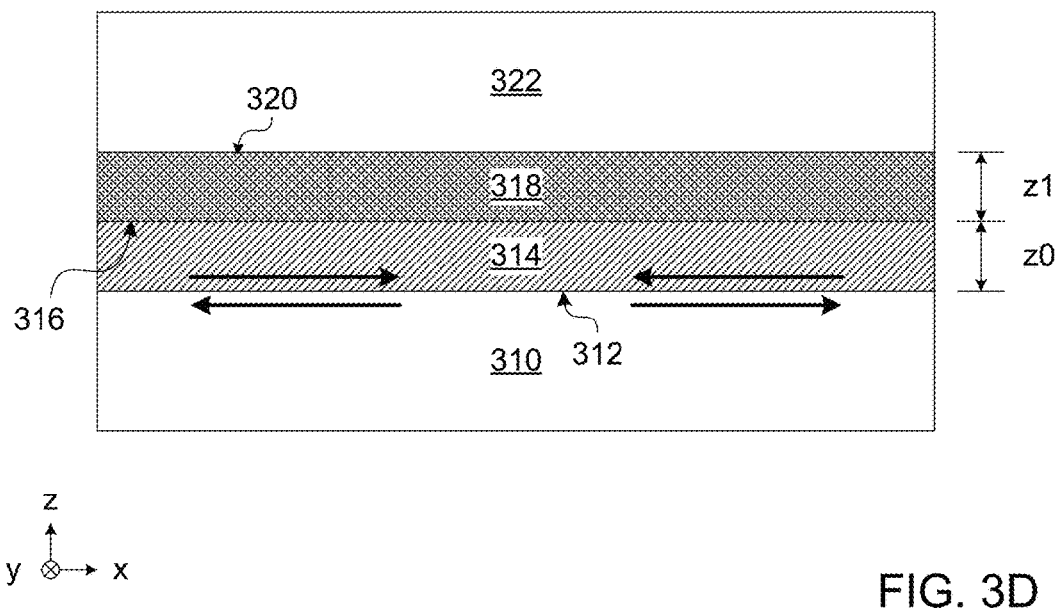

FIG. 3D shows a device 303 which results from additional processing of device 302 in FIG. 3C, according to an embodiment. For example, FIG. 3D shows an embodiment of a formation of a wafer 322 on a side 320 of capping layer 318. In some illustrative embodiments, lithographic patterning, etching, metallization and/or other suitable fabrication processes are performed to form via structures (not shown) which extend through stress modulation layer 314 and capping layer 318 to each of sides 312, 320. In one such embodiment, hybrid bonding or any of various other suitable wafer bond processes are performed to electrically couple such via structures each to a respective interconnect structure (not shown) of wafer 322.

In various embodiments, wafer 322 has features such as those of wafer 310. For example, in some embodiments, wafer 322 comprises any of various types of circuitry including, but not limited to, capacitors, diodes, transistors, memory devices, opto-electronic devices and/or the like. In an embodiment, once the processing of a wafer stack comprising wafers 310, 322 is completed, individual dies—each forming respective electronic apparatus—are cut from the completed wafer stack.

Figure 4A:
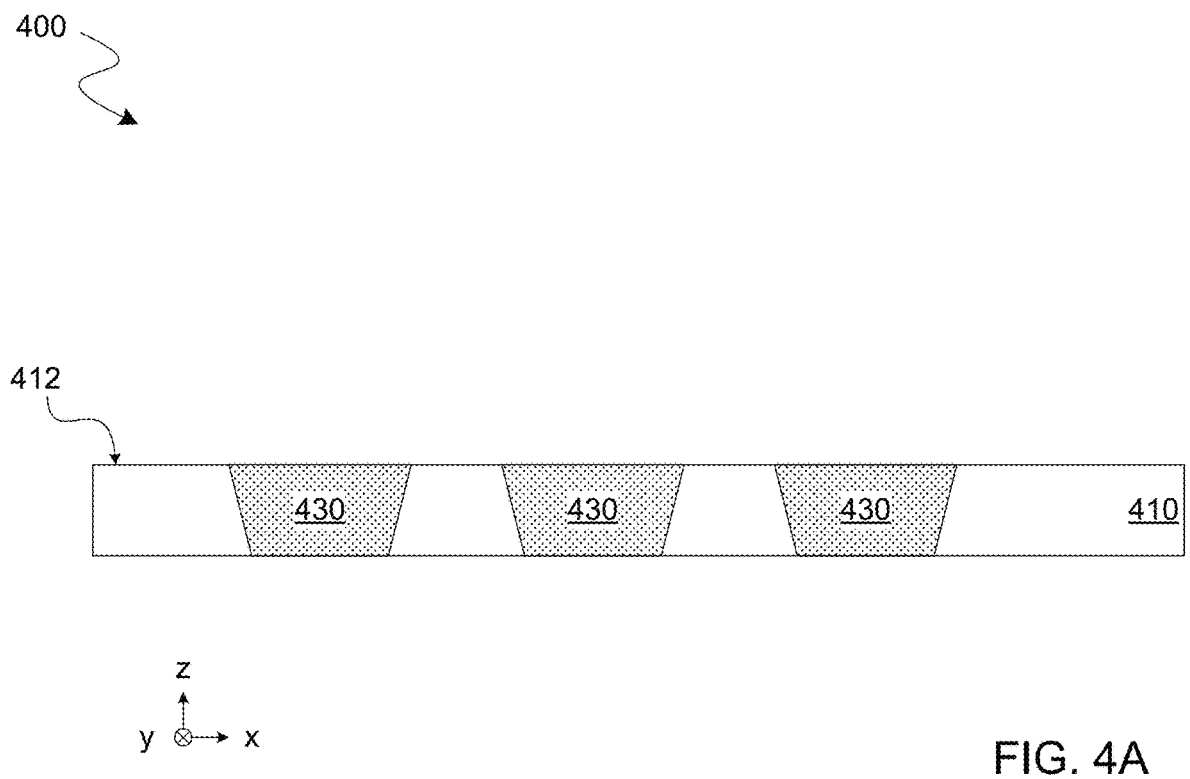
FIGS. 4A-4G are cross-sectional views of the wafer stack of FIG. 5 illustrating respective devices, each at a respective stage of processing, which form structures comprising a stress modulation layer and a capping layer, to mitigate wafer bowing according to some embodiments.
Figure 4B:
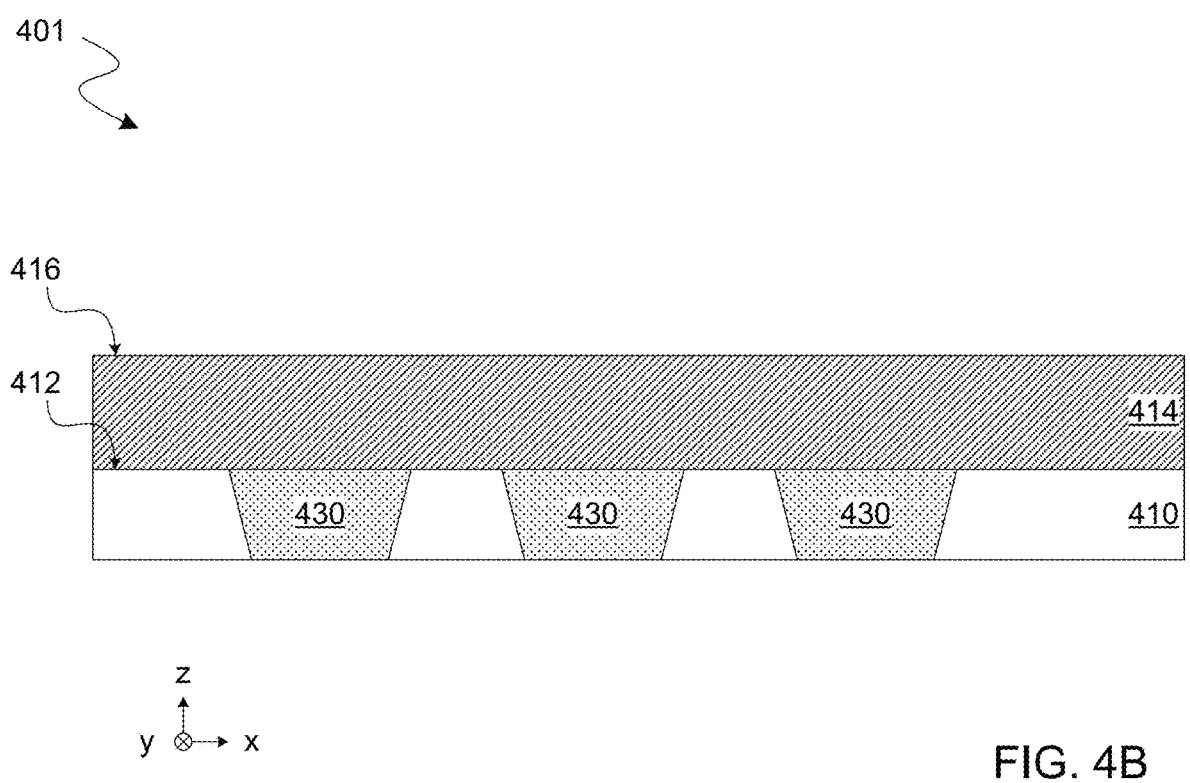
Figure 4C:
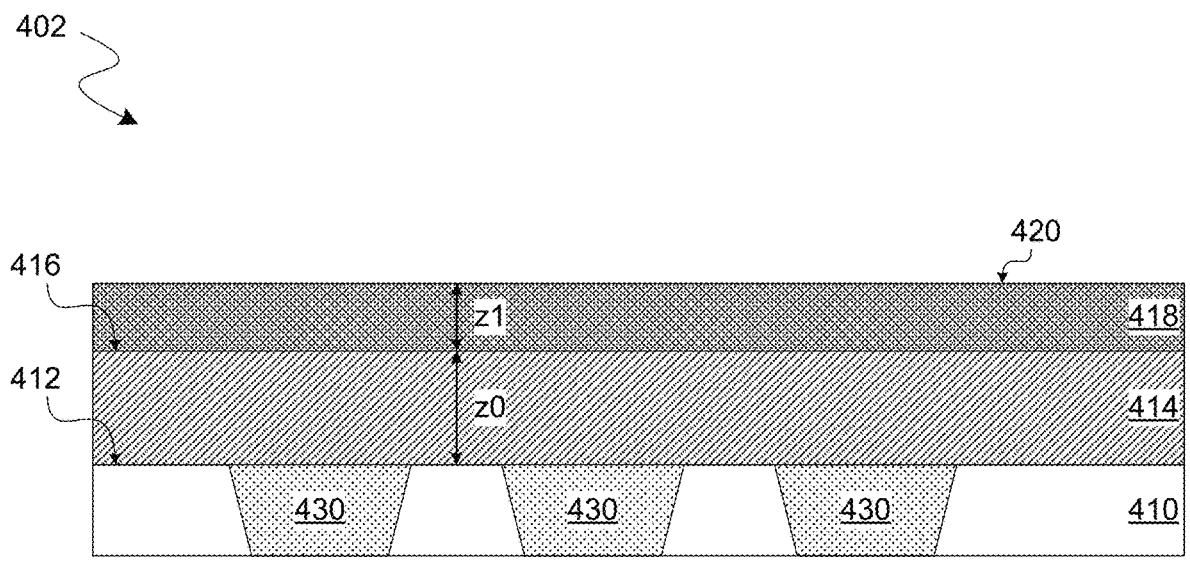
Figure 4D:
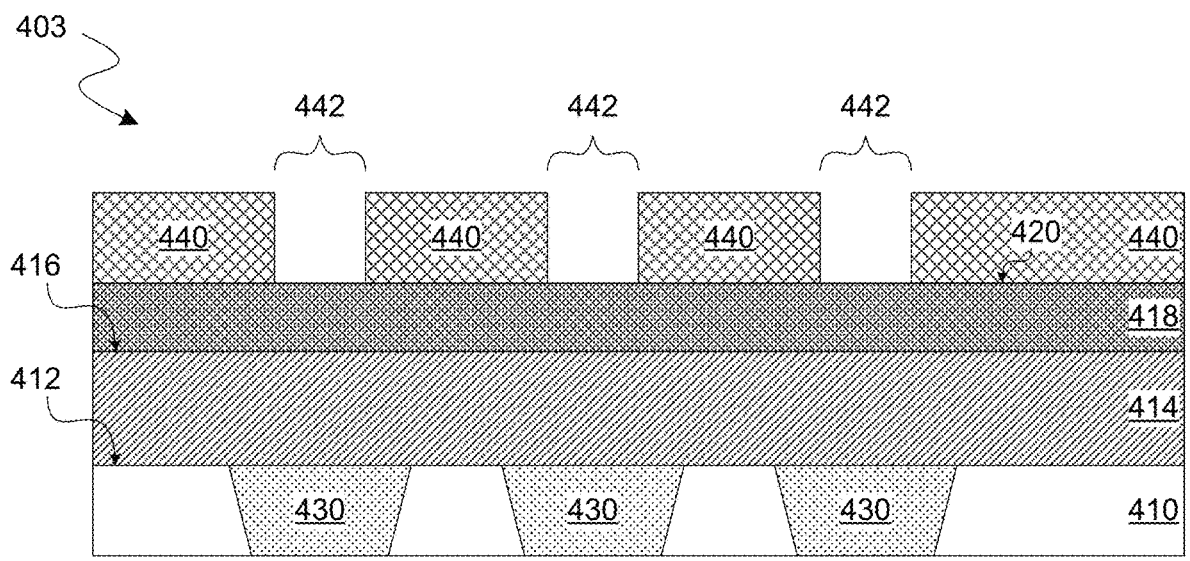
Figure 4E:
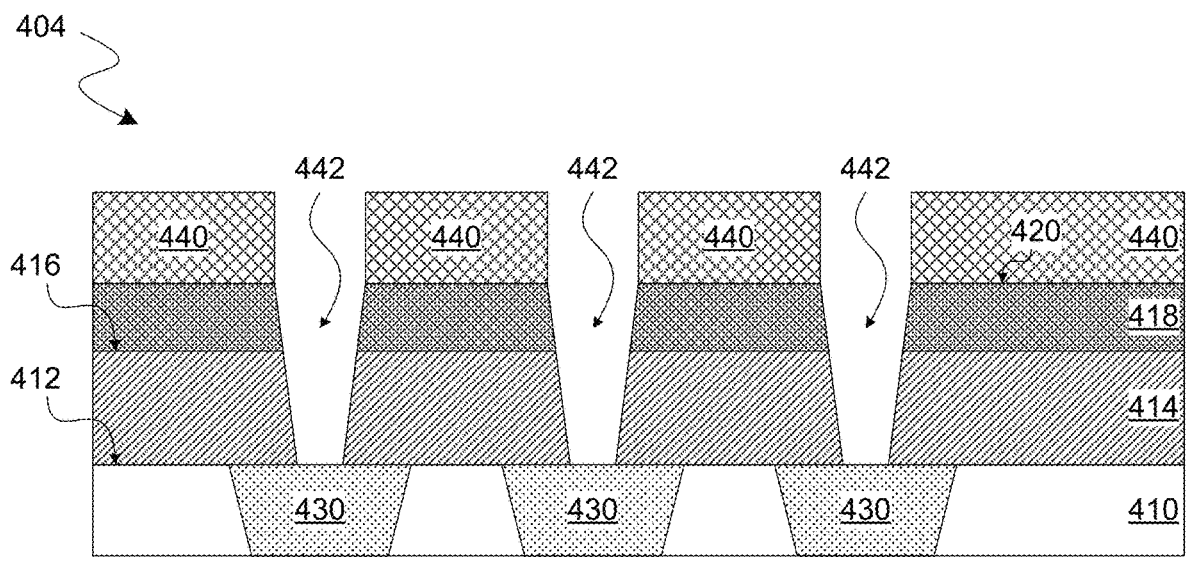
Figure 4F:
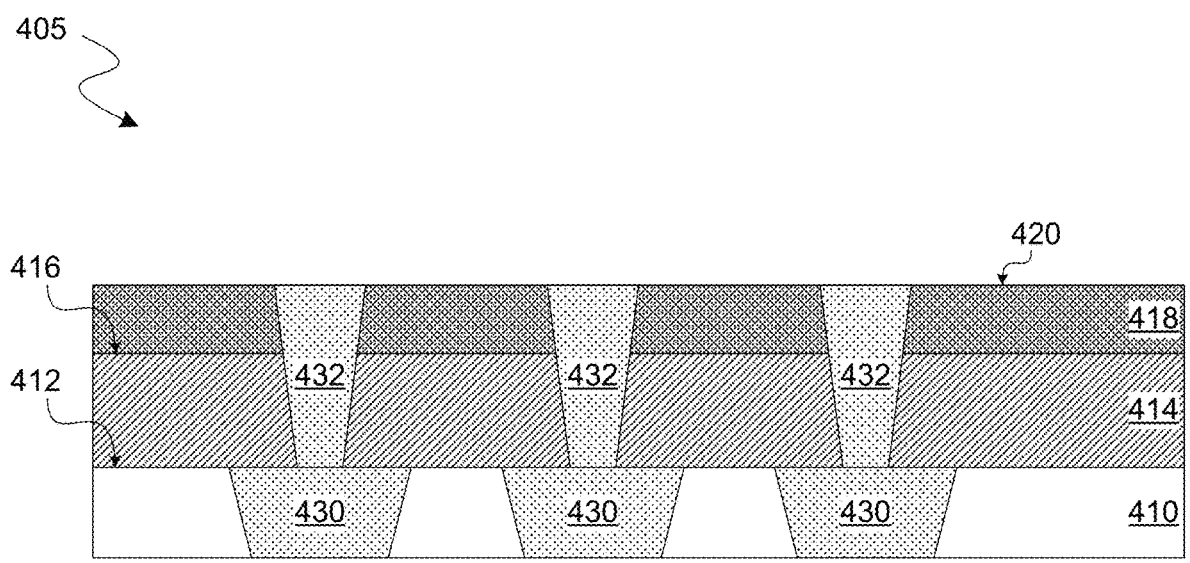
Figure 4G:
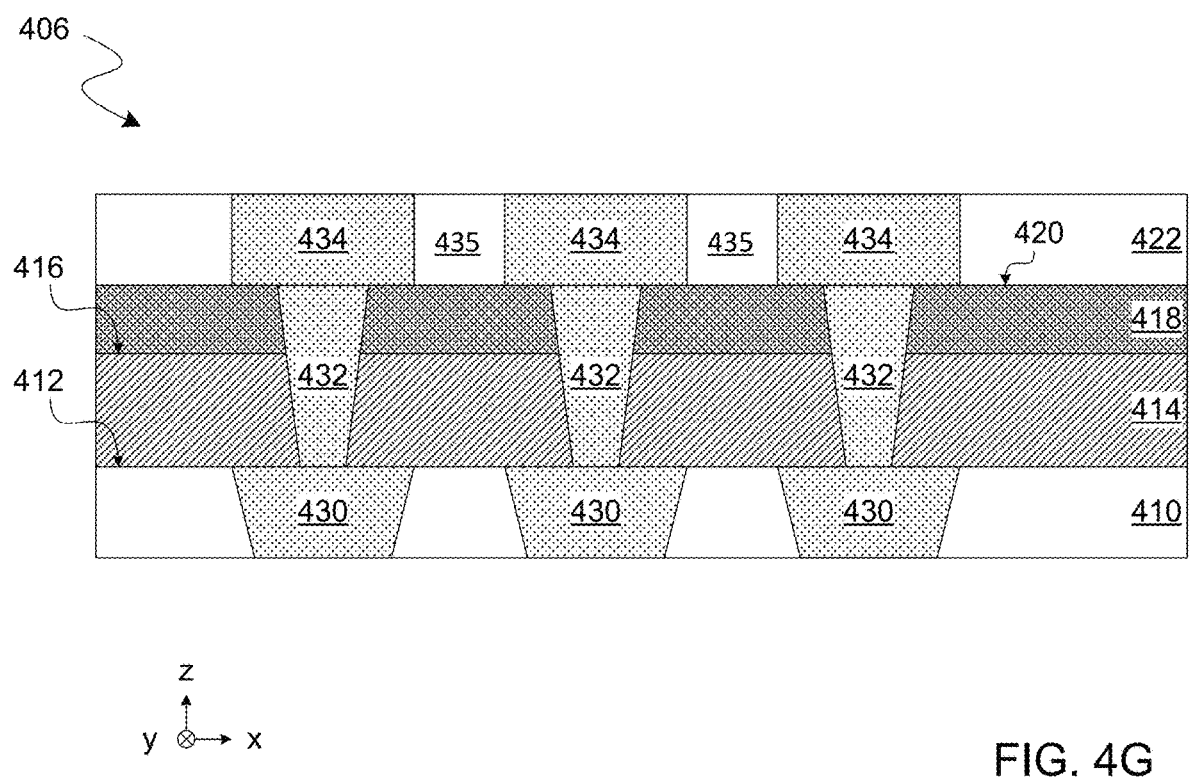
Figure 5:
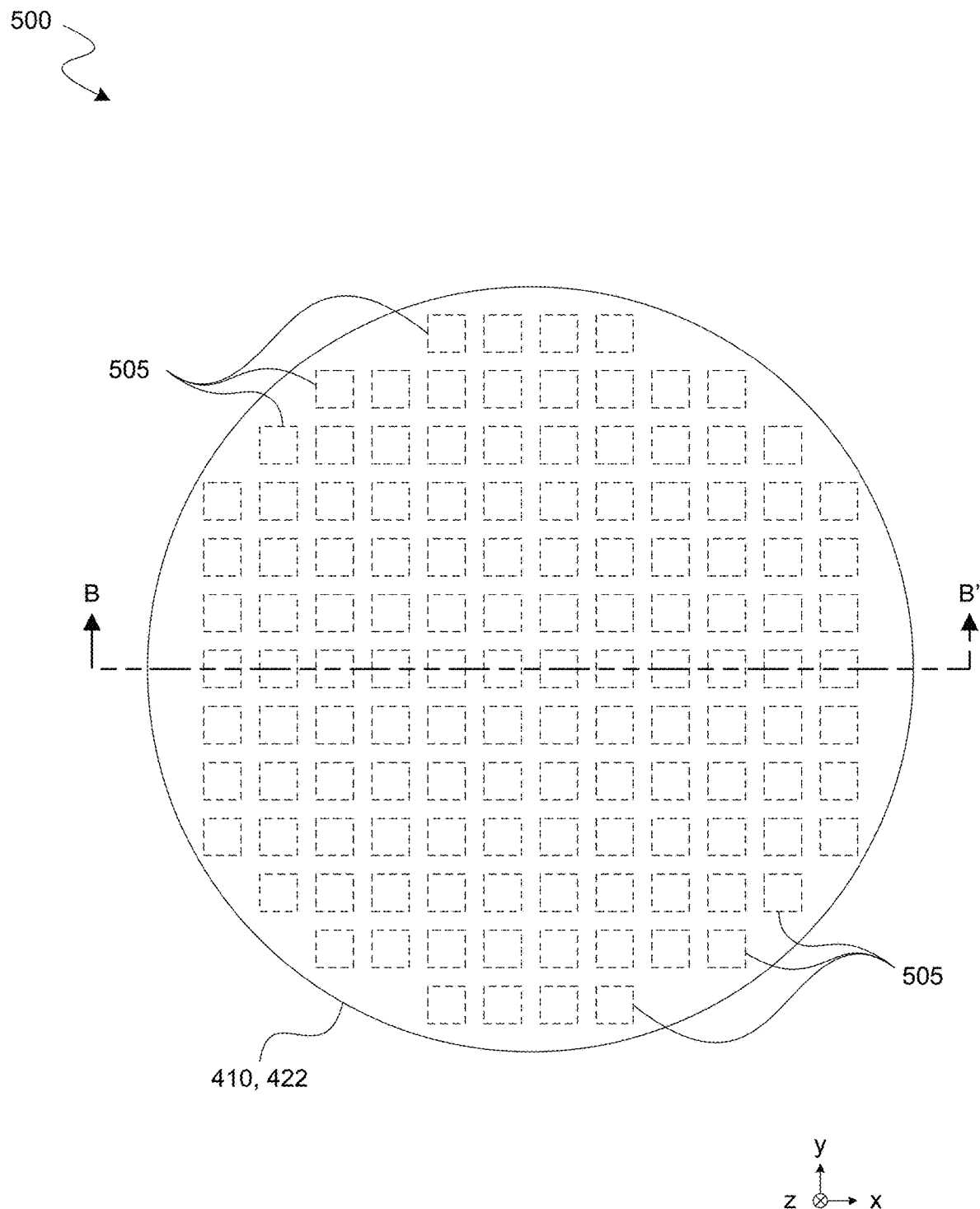
FIG. 5 is a plan view of a wafer stack according to some embodiments.

FIG. 5 is a plan view of a wafer stack 500 according to some embodiments. FIGS. 4A-4G are cross-sectional views of a portion of the wafer stack 500, as taken along line B-B' of FIG. 5. FIGS. 4A-4G illustrate respective portions of the wafer stack 500, each at a respective stage of processing, according to some embodiments. The wafer stack 500 comprises a plurality of devices, each comprising a stress modulation layer and a capping layer that together mitigate wafer bowing. Wafer stack 500 includes a first wafer 410 and a second wafer 422, each of the wafers 410, 422 comprising a substrate 510, 520, respectively.

FIG. 4A depicts a portion 400 of first wafer 410 which may be deformed by an intrinsic stress thereof (not shown). First wafer 410 comprises a surface 412 and interconnect structures 430.

FIG. 4B depicts a portion 401 of first wafer 410 which results from additional processing of portion 400 in FIG. 4A. As depicted in FIG. 4A, a stress modulation layer 414 is formed on side 412 of first wafer 410. The stress modulation layer 414 comprises a surface 416. Stress modulation layer 414 may be comprised of a material with an intrinsic stress greater than 100 MPa and a dielectric constant k greater than five. In some embodiments, a thickness z0 (along the z-axis shown) of stress modulation layer 414 is in a range of about ten nanometers (10 nm) to about ten micrometers (10 μm). In some embodiments, a thickness z0 (along the z-axis shown) of stress modulation layer 414 may be different in different regions on side 412 of first wafer 410. For example, a first region may exhibit a degree of bow below a threshold while a second region may exhibit bow greater than the threshold. The thickness z0 (along the z-axis shown) of stress modulation layer 414 may be thicker in the second region as compared to the first region. In some embodiments, an intrinsic stress of stress modulation layer 414 may be different in different regions on side 412 of first wafer 410. For example, a first region may exhibit a degree of bow below a threshold while a second region may exhibit bow greater than the threshold. The intrinsic stress of stress modulation layer 414 may have a higher value in the second region as compared to the first region.

FIG. 4C depicts a portion 402 of first wafer 410 which results from additional processing of portion 401 in FIG. 4B. As depicted in FIG. 4C, a capping layer 418 is formed on surface 416 of first wafer 410. The capping layer 418 comprises a surface 420. Capping layer 418 may be comprised of a material with an intrinsic stress on the order of 10 MPa or less, and a dielectric constant k less than four. In some embodiments, a thickness z1 of capping layer 418 is in a range of about ten nanometers (10 nm) to about ten micrometers (10 μm).

FIG. 4D depicts a portion 403 of first wafer 410 which results from additional processing of portion 402 in FIG. 4C. As depicted in FIG. 4D, a mask layer 440 having openings 442 defined therein is formed on surface 420 of first wafer 410.

FIG. 4E depicts a portion 404 of first wafer 410 which results from additional processing of portion 403 in FIG. 4D. As depicted in FIG. 4D, material is removed from stress modulation layer 414 and capping layer 418 in regions corresponding with openings 442 as defined by mask layer 440. The material may be removed by an etch process.

FIG. 4F depicts a portion 405 of first wafer 410 which results from additional processing of portion 404 in FIG. 4E. As depicted in FIG. 4F, via structures 432 are formed within the areas corresponding with the openings 442. The via structures 432 are comprised of conductive material, such as copper, and may be formed by any suitable process known in the art. In addition, mask layer 440 is removed, exposing surface 420 of first wafer 410.

FIG. 4G depicts a portion 406 of first wafer 410 which results from additional processing of portion 405 in FIG. 4F. As depicted in FIG. 4G, a second wafer 422 is formed on, or bonded to, first wafer 410. Second wafer 422 comprises interconnect structures 434 separated by dielectric material 435. Interconnect structures 434 are in contact with via structures 432, which extend through stress modulation layer 414 and capping layer 418, and contact interconnect structures 430.

Referring to these figures, the wafer stack 500 includes first wafer 410 and second wafer 422, each of the wafers 410, 422 comprising a substrate, respectively. The substrate of each wafer 410, 422 typically comprises a semiconductor material, such as Silicon (Si), Silicon-on-Insulator (SOI), Gallium Arsenide (GaAs), etc. Integrated circuitry for a number of stacked die 505 has been formed on each of the wafers 410, 422, and the wafer stack 500 is ultimately cut into these separate stacked die 505. The integrated circuitry for each stacked die 505 may include a number of active devices (e.g., transistors, capacitors, etc.) formed on a substrate of first wafer 410 and a number of active devices formed on a substrate of second wafer 422.

Formed in or on a surface 412 of first wafer 410 are interconnect structures 430, and formed in or on a surface of the second wafer 422 are interconnect structure 434. Generally, each of the interconnect structures 430, 434 comprises, or couples to, a number of levels of metallization, each layer of metallization separated from adjacent levels each by a respective one or more dielectric layer structures, and interconnected with the adjacent levels by vias. For example, a dielectric layer structure between interconnects 430, 434—referred to as an "interlayer dielectric" (or "ILD")— comprises stress modulation layer 414 and capping layer 418. The patterned conductive structures of the metallization layers comprise a number of interconnect structures (e.g., traces) that, for example, route respective signal, power, and/or ground lines to and from the integrated circuitry of a given die 505, and this metallization comprises a conductive material, such as copper, aluminum, silver, gold, as well as alloys of these (or other) materials. Disposed between (and electrically coupling) the interconnect structures 430, 434 are via structures 432 which extend through stress modulation layer 414 and capping layer 418.

In one embodiment, the first and second wafers 410, 422 have the same size and shape; however, in another embodiment, these wafers have differing shapes and/or sizes. In one embodiment, the first and second wafers 410, 422 comprise the same material, and in a further embodiment, the first and second wafers 410, 422 comprise different materials. Also, although the wafers 410, 422 may be fabricated using substantially the same process flow, in another embodiment, the wafers 410, 422 are fabricated using different process flows. In one embodiment, one of the wafers (e.g., wafer 410) includes logic circuitry formed using a first process flow, and the other wafer (e.g., wafer 422) includes memory circuitry (e.g., DRAM, SRAM, etc.) that is formed using a second, different process flow. Thus, as the reader will appreciate, the disclosed embodiments are applicable to any type of wafer or combination of wafers—irrespective of size, shape, material, architecture, and/or process flow—and, as used herein, the term "wafer" should not be limited in scope to any particular type of wafer or wafer combination.

Ultimately, the wafer stack 500 will be cut into a number of separate stacked die 505, as noted above. Each stacked die will include a die from first wafer 410 and a die from the second wafer 422. These two stacked die will be interconnected—both electrically and mechanically—by some of the interconnects 432.

While FIGS. 4A-4G illustrate stages of processing wafer stack 500 comprised of first and second wafers 410, 422, it should be appreciated that the stages of processing depicted in FIGS. 4A-4G apply to stacking individual die on first wafer 410. In other words, in some embodiments, second wafer 422 may be an integrated circuit (IC) die. In some embodiments, singulated IC die are vertically stacked after all the metallization layers in the separate IC dies have been completed on a wafer according to known die stacking techniques.

The above-described embodiments for forming an ILD structure comprising a stress modulation layer and a capping layer have been explained, at least in part, in the context of forming a three-dimensional wafer stack. However, it should be understood that the disclosed embodiments are not limited in application to wafer stacking and, further, that the disclosed embodiments may find use in other devices or applications. For example, the above-described embodiments are additionally or alternatively used to form an ILD structure between structures of a single wafer.

Also, it should be noted that, in FIGS. 4A-4G, a limited number of bond structures and interconnects are shown for ease of illustration. As the reader will appreciate, the wafers 110, 122 of FIGS. 1A-1D, wafers 310, 322 of FIGS. 3A-3D, and/or wafers 410, 422 of FIGS. 4A-4G may include thousands or perhaps millions of such interconnects. Similarly, integrated circuitry formed in wafers 410, 422 for each stacked die 505 may, in practice, include tens of millions, or even hundreds of millions, of active devices (e.g., transistors). Thus, it should be understood that FIGS. 1A-1D, and 3A-3D (as well as FIGS. 4A-4G) are simplified schematic representations presented merely as an aid to understanding the disclosed embodiments and, further, that no unnecessary limitations should be drawn from these schematic representations.

Figure 6:
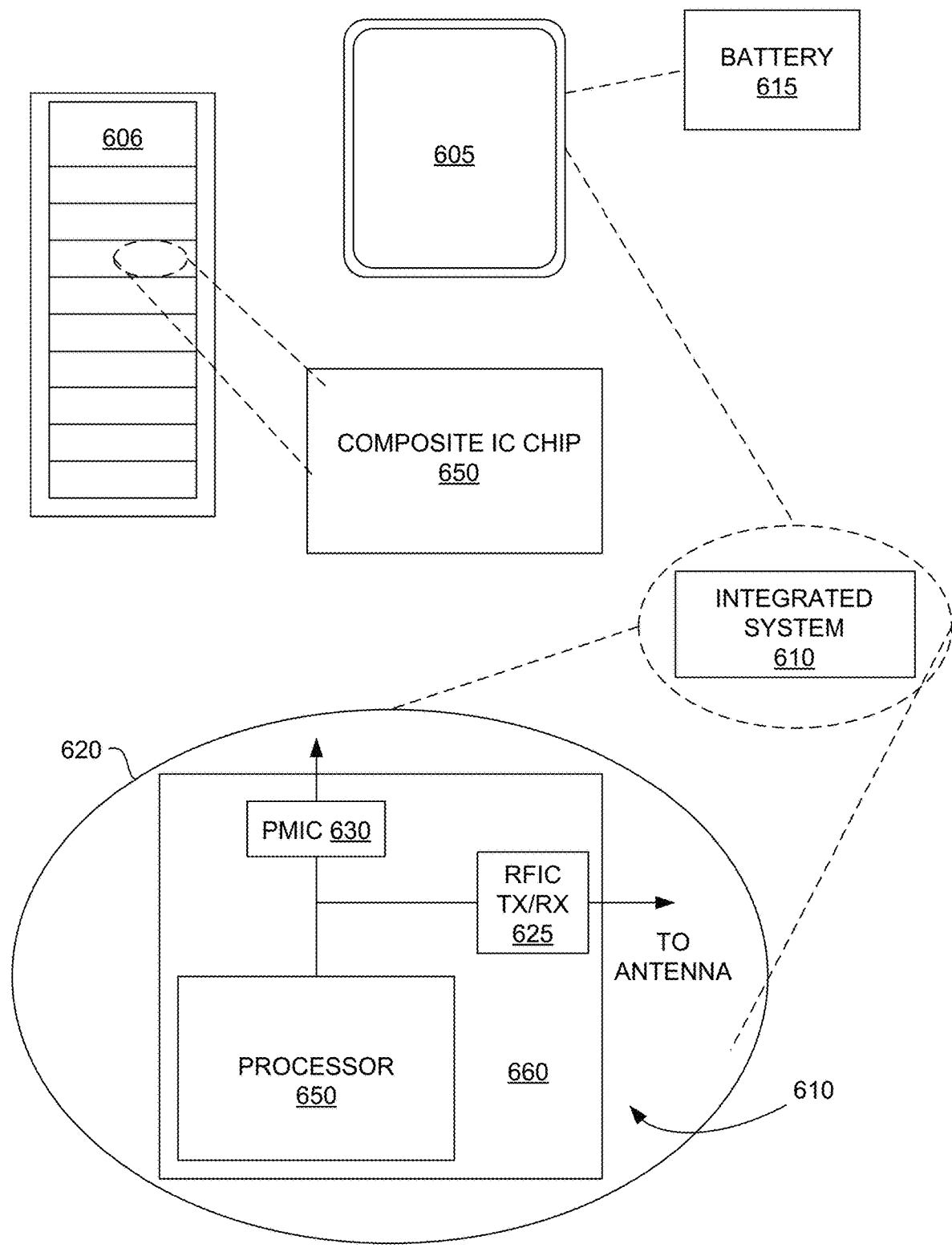
FIG. 6 illustrates a mobile computing platform and a data server machine employing an interlayer dielectric structure in a wafer, the interlayer dielectric structure comprising stress modulation layer and a capping layer, in accordance with some embodiments.

FIG. 6 illustrates a mobile computing platform 605 and a data server machine 606 employing an ILD structure in a wafer, the ILD structure comprising stress modulation layer and a capping layer, for example as described elsewhere herein. Server machine 606 may be any commercial server, for example including any number of high-performance computing platforms disposed within a rack and networked together for electronic data processing, which in the exemplary embodiment includes an ILD structure in a wafer, the ILD structure comprising stress modulation layer and a capping layer, for example as described elsewhere herein. The mobile computing platform 605 may be any portable device configured for each of electronic data display, electronic data processing, wireless electronic data transmission, or the like. For example, the mobile computing platform 605 may be any of a tablet, a smart phone, laptop computer, etc., and may include a display screen (e.g., a capacitive, inductive, resistive, or optical touchscreen), an integrated system 66, and a battery 615.

As illustrated in the expanded view 620, the processor 650 comprising an ILD structure in a wafer, the ILD structure comprising stress modulation layer and a capping layer. The processor 650 is further coupled PMIC (power management IC) 630 and an RF (wireless) integrated circuit (RFIC) 625 including a wideband RF (wireless) transmitter and/or receiver. PMIC 630 may perform battery power regulation, DC-to-DC conversion, etc., and so has an input coupled to battery 615 and with an output providing a current supply to other functional modules. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond.

Figure 7:
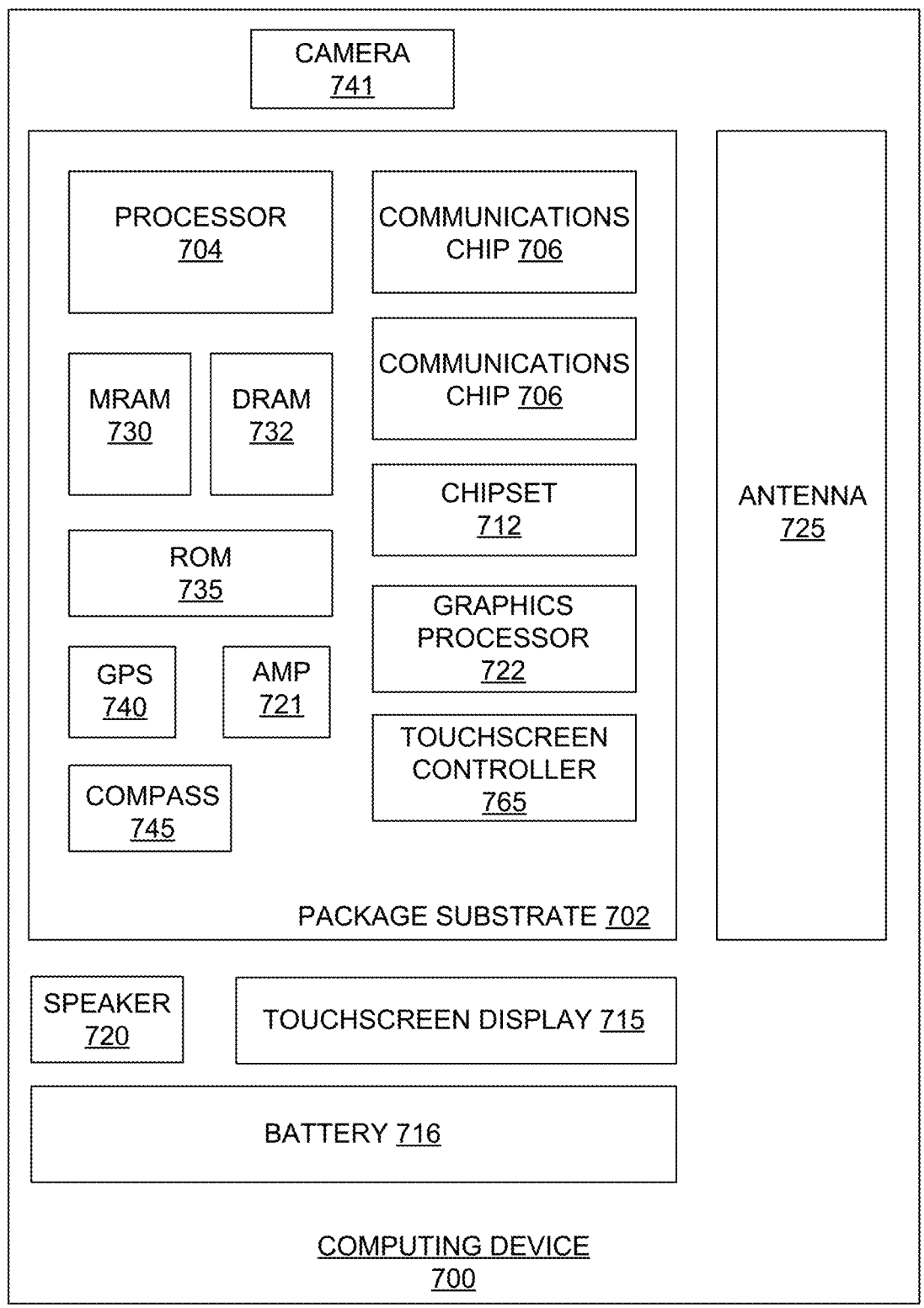
FIG. 7 is a functional block diagram of an electronic computing device comprising a processor that comprises an interlayer dielectric structure in a wafer, the interlayer dielectric structure comprising stress modulation layer and a capping layer, in accordance with some embodiments.

FIG. 7 is a functional block diagram of an electronic computing device 700, in accordance with an embodiment of the present invention. Computing device 700 may be found inside either mobile computing platform 1005 or server machine 1006, for example. Device 700 further includes a package substrate 702 hosting a number of components, such as, but not limited to, a processor 704 (e.g., an applications processor). Processor 704 may be physically and/or electrically coupled to package substrate 702. In some examples, processor 704 comprises an ILD structure in a wafer, the ILD structure comprising stress modulation layer and a capping layer, for example as described elsewhere herein. Processor 704 may be implemented with circuitry in any or all of the IC die of the composite IC die package. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the package substrate 702. In further implementations, communication chips 706 may be part of processor 704. Depending on its applications, computing device 700 may include other components that may or may not be physically and electrically coupled to package substrate 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, at least two of the functional blocks noted above comprise an ILD structure in a wafer, the ILD structure comprising stress modulation layer and a capping layer, for example as described elsewhere herein. For example, processor 704 be implemented with circuitry in an IC die on a first side of the interposer, and an electronic memory (e.g., MRAM 730 or DRAM 732) may be implemented with circuitry in an IC die on a second side of the interposer.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An integrated circuit (IC) die comprising: a first metallization layer comprising first interconnect structures which each extend through the first metallization layer; a second metallization layer comprising second interconnect structures which each extend through the second metallization layer; an interlayer dielectric (ILD) stack between the first metallization layer and the second metallization layer, the ILD stack comprising: a stress modulation layer on the first metallization layer, wherein a first intrinsic stress in a first material of the stress modulation layer is to mitigate a second intrinsic stress in the first metallization layer; and a capping layer on the stress modulation layer, the capping layer comprising a second material other than the first material; via structures which extend through the stress modulation layer and the capping layer to couple each of the first interconnect structures to a respective one of the second interconnect structures.

Example 2: The IC die of example 1, wherein the second material in the capping layer comprises one of an oxide or a carbon-doped oxide.

Example 3: The IC die of example 1, wherein the second material in the capping layer has a dielectric constant of four or less.

Example 4: The IC die of example 1, wherein the second material in the capping layer has a thickness between ten nanometers and ten micrometers.

Example 5: The IC die of example 1, wherein the second material in the capping layer has an intrinsic stress of ten megapascal (MPa) or less.

Example 6: The IC die of example 1, wherein the first material of the stress modulation layer comprises one or more of silicon dioxide or silicon nitride.

Example 7: The IC die of example 1, wherein the first material of the stress modulation layer has a dielectric constant of at least five.

Example 8: The IC die of example 1, wherein the first material of the stress modulation layer has a thickness between ten nanometers and ten micrometers.

Example 9: The IC die of example 1, wherein the second material in the capping layer has an intrinsic stress of at least one hundred megapascal (MPa).

Example 10: A method comprising: providing a wafer comprising a first metallization layer comprising first interconnect structures which each extend to a first side of the first metallization layer; forming on the first side a stress modulation layer of an inter-layer dielectric (ILD) stack; forming on a second side of the stress modulation layer a capping layer of the ILD stack; patterning the stress modulation layer and the capping layer; forming via structures which each extend to a respective one of the first interconnect structures, and through the stress modulation layer and the capping layer, to a third side of the capping layer; and providing a second metallization layer at the third side, wherein the second metallization layer comprises second interconnect structures each coupled to a respective one of the via structures; wherein a first intrinsic stress in a first material of the stress modulation layer is to mitigate a second intrinsic stress in the first metallization layer, wherein the capping layer comprises a second material other than the first material.

Example 11: The method of example 10, wherein the forming on the first side a stress modulation layer of an ILD stack further comprises: forming the stress modulation layer in a first thickness in a first region of the first side and in a second thickness in a second region of the first side, wherein the first thickness is different than the second thickness.

Example 12: The method of example 10, wherein the forming on the first side a stress modulation layer of an ILD stack further comprises: forming first portion of the stress modulation layer with a first intrinsic stress value in a first region of the first side and forming a second portion of the stress modulation layer with a second intrinsic stress value in a second region of the first side, wherein the first intrinsic stress value is different than the second intrinsic stress value.

Example 13: A system comprising: a power supply; an integrated circuit (IC) die coupled to the power supply, comprising: a first metallization layer comprising first interconnect structures which each extend through the first metallization layer; a second metallization layer comprising second interconnect structures which each extend through the second metallization layer; an interlayer dielectric (ILD) stack between the first metallization layer and the second metallization layer, the ILD stack comprising: a stress modulation layer on the first metallization layer, wherein a first intrinsic stress in a first material of the stress modulation layer is to mitigate a second intrinsic stress in the first metallization layer; and a capping layer on the stress modulation layer, the capping layer comprising a second material other than the first material; and via structures which extend through the ILD stack.

Example 14: The system of example 13, wherein the second material in the capping layer comprises one of an oxide or a carbon-doped oxide.

Example 15: The system of example 13, wherein the second material in the capping layer has a dielectric constant of four or less.

Example 16: The system of example 13, wherein the second material in the capping layer has an intrinsic stress of ten megapascal (MPa) or less.

Example 17: The system of example 13, wherein the first material of the stress modulation layer comprises one or more of silicon dioxide or silicon nitride.

Example 18: The system of example 13, wherein the first material of the stress modulation layer has a dielectric constant of at least five.

Example 19: The system of example 13, wherein the first material of the stress modulation layer has a thickness between ten nanometers and ten micrometers.

Example 20: The system of example 13, wherein the second material in the capping layer has an intrinsic stress of at least one hundred megapascal (MPa).

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) die comprising:
   a first metallization layer comprising first interconnect structures which each extend through the first metallization layer;
   a second metallization layer comprising second interconnect structures which each extend through the second metallization layer;
   an interlayer dielectric (ILD) stack between the first metallization layer and the second metallization layer, the ILD stack comprising:
      a stress modulation layer on the first metallization layer, wherein a first intrinsic stress in a first material of the stress modulation layer is to mitigate a second intrinsic stress in the first metallization layer; and
      a capping layer on the stress modulation layer, the capping layer comprising a second material;
   via structures which extend through the stress modulation layer and the capping layer to couple each of the first interconnect structures to a respective one of the second interconnect structures.

2. The IC die of claim 1, wherein the second material in the capping layer comprises one of an oxide or a carbon-doped oxide.

3. The IC die of claim 1, wherein the second material in the capping layer has a dielectric constant of four or less.

4. The IC die of claim 1, wherein the second material in the capping layer has a thickness between ten nanometers and ten micrometers.

5. The IC die of claim 1, wherein the second material in the capping layer has an intrinsic stress of ten megapascal (MPa) or less.

6. The IC die of claim 1, wherein the first material of the stress modulation layer comprises one or more of silicon dioxide or silicon nitride.

7. The IC die of claim 1, wherein the first material of the stress modulation layer has a dielectric constant of at least five.

8. The IC die of claim 1, wherein the first material of the stress modulation layer has a thickness between ten nanometers and ten micrometers.

9. The IC die of claim 1, wherein the second material in the capping layer has an intrinsic stress of at least one hundred megapascal (MPa).

10. A system comprising:
    a power supply;
    an integrated circuit (IC) die coupled to the power supply, comprising:
    a first metallization layer comprising first interconnect structures which each extend through the first metallization layer;
    a second metallization layer comprising second interconnect structures which each extend through the second metallization layer;
    an interlayer dielectric (ILD) stack between the first metallization layer and the second metallization layer, the ILD stack comprising:
       a stress modulation layer on the first metallization layer, wherein a first intrinsic stress in a first material of the stress modulation layer is to mitigate a second intrinsic stress in the first metallization layer; and
       a capping layer on the stress modulation layer, the capping layer comprising a second material; and
    via structures which extend through the ILD stack.

11. The system of claim 10, wherein the second material in the capping layer comprises one of an oxide or a carbon-doped oxide.

12. The system of claim 10, wherein the second material in the capping layer has a dielectric constant of four or less.

13. The system of claim 10, wherein the second material in the capping layer has an intrinsic stress of ten megapascal (MPa) or less.

14. The system of claim 10, wherein the first material of the stress modulation layer comprises one or more of silicon dioxide or silicon nitride.

15. The system of claim 10, wherein the first material of the stress modulation layer has a dielectric constant of at least five.

16. The system of claim 10, wherein the first material of the stress modulation layer has a thickness between ten nanometers and ten micrometers.

17. The system of claim 10, wherein the second material in the capping layer has an intrinsic stress of at least one hundred megapascal (MPa).

* * * * *